(12) United States Patent
Oohira

(10) Patent No.: US 7,557,888 B2
(45) Date of Patent: Jul. 7, 2009

(54) LIQUID CRYSTAL DISPLAY DEVICE

(75) Inventor: Eiji Oohira, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 12/289,894

(22) Filed: Nov. 6, 2008

(65) Prior Publication Data

US 2009/0073340 A1    Mar. 19, 2009

Related U.S. Application Data

(63) Continuation of application No. 11/502,464, filed on Aug. 11, 2006, now Pat. No. 7,463,325.

(30) Foreign Application Priority Data

Oct. 20, 2005   (JP)   ............................. 2005-305183

(51) Int. Cl.
  *G02F 1/1345*    (2006.01)
(52) U.S. Cl. ..................................................... 349/149
(58) Field of Classification Search ................. 349/149, 349/147, 153
  See application file for complete search history.

(56) References Cited

U.S. PATENT DOCUMENTS

| 6,411,353 | B1 * | 6/2002 | Yarita et al. .................... 349/59 |
| 2005/0094052 | A1 | 5/2005 | Sakurai et al. |
| 2005/0213924 | A1 | 9/2005 | Sakurai et al. |
| 2006/0072315 | A1 | 4/2006 | Han et al. |
| 2008/0225221 | A1 * | 9/2008 | Abe ............................ 349/153 |

FOREIGN PATENT DOCUMENTS

| JP | 2001-133756 | 11/1999 |
| JP | 2004-029651 | 6/2002 |
| JP | 2004-062048 | 7/2002 |

* cited by examiner

*Primary Examiner*—Frank G Font
*Assistant Examiner*—Eric Wong
(74) *Attorney, Agent, or Firm*—Reed Smith LLP; Juan Carlos A. Marquez, Esq.

(57) ABSTRACT

The present invention aims at the miniaturization and the reduction of thickness of a liquid crystal display device. In a liquid crystal display device which includes: a liquid crystal display panel; a backlight which is arranged on a back-surface side of the liquid crystal display panel; and a flexible printed wiring board which has one end thereof connected to a terminal portion of the liquid crystal display panel, wherein the backlight includes a frame-like mold and a light source, the flexible printed wiring board is folded outside a frame of the frame-like mold and has a portion thereof arranged on a back-surface side of the frame-like mold, the light source is housed in the inside of the frame of the frame-like mold; and the light source is mounted on a surface which opposedly faces the liquid crystal display panel in a state that the flexible printed wiring board is folded out of surfaces of the flexible printed wiring board in the vicinity of a bent portion of the flexible printed wiring board, and the flexible printed wiring board has a cutout therein in a periphery of the light source.

10 Claims, 10 Drawing Sheets

LIQUID CRYSTAL DISPLAY DEVICE

CROSS REFERENCE TO RELATED APPLICATIONS

This application is a Continuation of nonprovisional U.S. application Ser. No. 11/502,464 filed Aug. 11, 2006 now U.S. Pat. No. 7,463,325. Priority is claimed based on U.S. application Ser. No. 11/502,464 filed Aug. 11, 2006, which claims the priority of Japanese application JP2005-305183 filed on Oct. 20, 2005, the content of which is hereby incorporated by reference into this application.

BACKGROUND OF THE INVENTION

The present invention relates to a liquid crystal display device, and more particularly to a technique which is effectively applicable to a backlight which accommodates a light guide plate, an optical sheet group and the like or a technique which is effectively applicable to a flexible printed wiring board.

A liquid crystal display module of a TFT (thin film transistor) system having a miniaturized liquid crystal display panel with the number of sub pixels of approximately 240× 320×3 in color display has been popularly used as a display part of a portable equipment such as a mobile phone.

In general, a liquid crystal display module includes a liquid crystal display panel and a backlight which radiates light to the liquid crystal display panel. With respect to the liquid crystal display module which is used as a display part of a portable equipment such as a mobile phone, the backlight is constituted of a resin frame mold (hereinafter referred to as mold), an optical sheet group and a light guide plate which are arranged in the inside of the mold, a reflection sheet which is arranged below the light guide plate, and a light source (for example, a white light emitting diode) which is arranged on a side surface of the light guide plate.

Figure 13A:
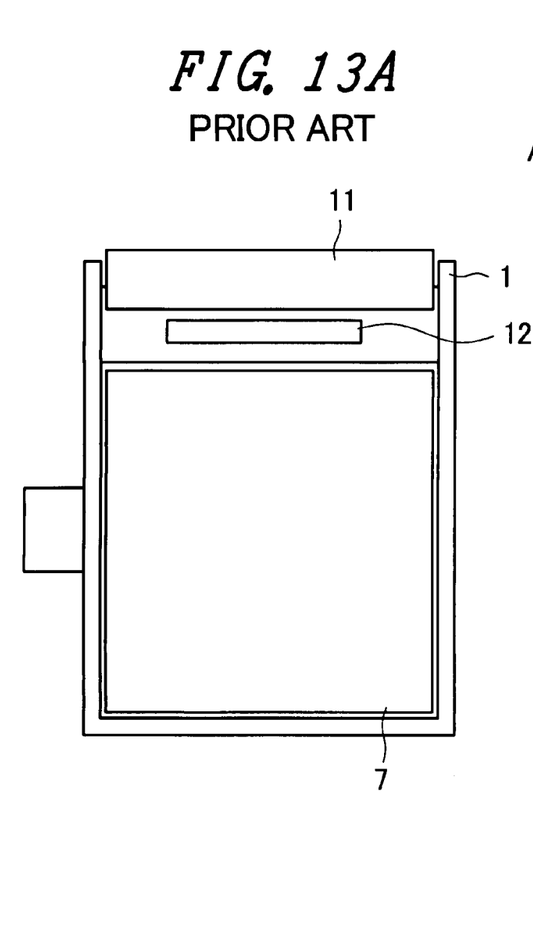
FIG. 13A to FIG. 13C are views for explaining a liquid crystal display module for a conventional mobile phone.
Figure 13B:
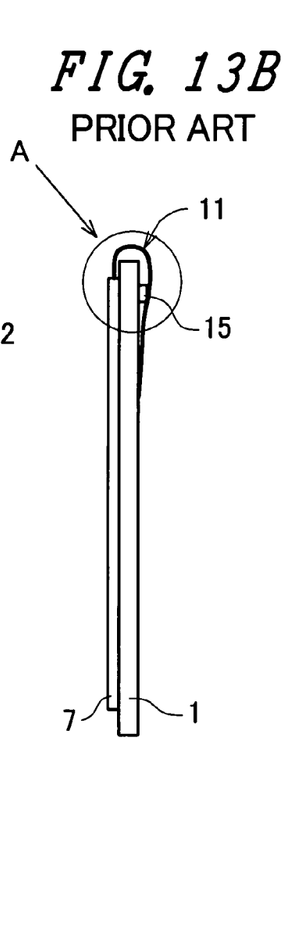
Figure 13C:
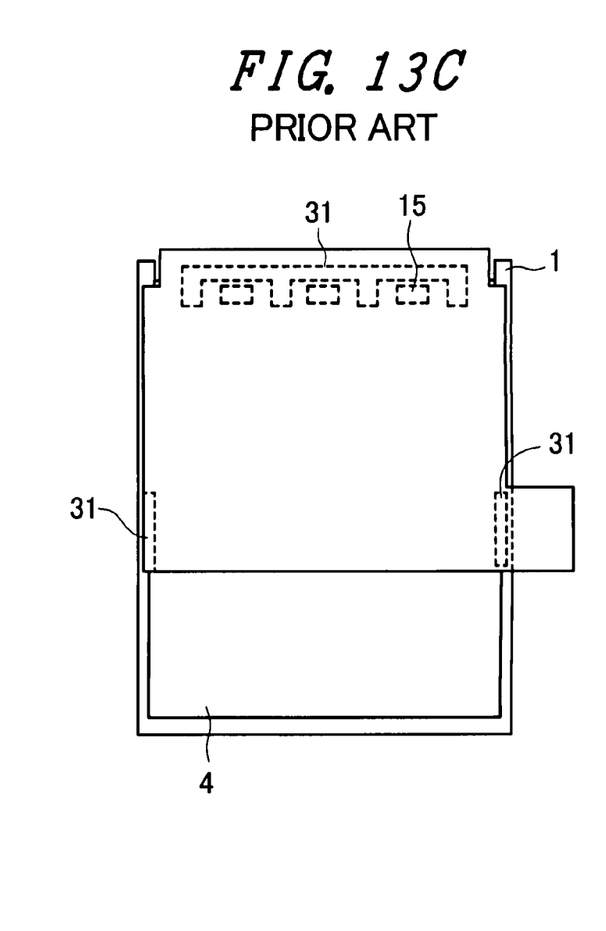

FIG. 13A to FIG. 13C are views for explaining the liquid crystal display module for a conventional mobile phone. FIG. 13A is a view as viewed from above (a liquid crystal display panel side, a front side, or a viewer's side), FIG. 13B is a view as viewed in a side view, and FIG. 13C is a view as viewed from below (a light guide plate side, a back-surface side, or a back side).

In the liquid crystal display module shown in FIG. 13A to FIG. 13C, a flexible printed wiring board (hereinafter, referred to as an FPC) 11 is folded and is wrapped around and fixed to the back surface side of the backlight for realizing the miniaturization and the reduction of thickness.

Further, on the FPC 11, electronic parts such as resistors and capacitors, and a white light emitting diode 15 which constitutes a light source are mounted. The white light emitting diode 15 is arranged in the vicinity of a folded portion of the FPC 11 and is arranged so as to face a light incident surface of a light guide plate not shown in the drawings in an opposed manner.

Here, when the FPC 11 is wrapped around the back surface from a terminal portion of the liquid crystal display panel with a minimum radius, the FPC 11 possesses a strong bending repulsive force (hereinafter, referred to as a spring-back force) and hence, the vicinity of the folded portion is fixed to a mold 1 using a pressure-sensitive adhesive double-coated tape 31.

Here, in FIG. 13A to FIG. 13C, numeral 4 indicates a reflection sheet which constitutes a portion of the backlight, numeral 7 indicates an upper polarizer, and numeral 12 indicates a semiconductor chip which constitutes a drive circuit.

Here, as prior art documents relevant to the present invention, following patent documents can be named.
[Patent Document 1] JP-A-2001-133756
[Patent Document 2] JP-A-2004-29651
[Patent Document 3] JP-A-2004-62048

SUMMARY OF THE INVENTION

The above-mentioned conventional structural examples shown in FIG. 13A to FIG. 13C have drawbacks that, when the bending repulsive force (the spring-back force) of the FPC 11 which is folded back to the back surface of backlight is extremely large, the fixing the FPC 11 with a tape cannot prevent the spring-back of the FPC 11 and hence, as indicated by symbol A shown in FIG. 13B, the FPC 11 is bulged or floated in a mounting region of the white light emitting diode 15 and the white light emitting diode 15 is shifted (shifted in the Z direction with respect to the center of the light guide plate) from a proper position thereof thus lowering the brightness.

To suppress the bulging or the floating of the FPC 11, it may be possible to arrange the fixing position of the FPC 11 using the pressure-sensitive adhesive double-coated tape 31 so as to increase a tape adhering area. When a fixing force is still insufficient with such an arrangement of the fixing position of the FPC 11, it is necessary to cover the FPC 11 from above with a metal plate or the like. This hinders the miniaturization and the reduction of thickness of the liquid crystal display module.

The present invention has been made to overcome the drawbacks of the related art and it is an advantageous effect of the present invention to provide a technique which can realize the miniaturization and the reduction of the thickness of a liquid crystal display device.

The above-mentioned and other advantageous effects and novel features of the present invention will become apparent from the description of this specification and attached drawings.

To briefly explain the summary of typical inventions among the inventions disclosed in this specification, they are as follows.

(1) In a liquid crystal display device which includes a liquid crystal display panel, a backlight which is arranged on a back-surface side of the liquid crystal display panel, and a flexible printed wiring board which has one end thereof connected to a terminal portion of the liquid crystal display panel,
 the backlight includes a frame-like mold and a light source,
 the flexible printed wiring board is folded outside a frame of the frame-like mold and has a portion thereof arranged on a back-surface side of the frame-like mold,
 the light source is housed in the inside of the frame of the frame-like mold; and
 the light source is mounted on a surface which opposedly faces the liquid crystal display panel in a state that the flexible printed wiring board is folded out of surfaces of the flexible printed wiring board in the vicinity of a bent portion of the flexible printed wiring board, and
 the flexible printed wiring board has a cutout therein in a periphery of the light source.

(2) The present invention is, in the above-mentioned constitution (1), characterized in that the frame-like mold includes a first side wall which is positioned on a side at which the flexible printed wiring board is folded, a second side wall which is positioned on one end side of the first side wall, and a third side wall which is positioned on another end side of the first side wall and opposedly faces the second side wall, wherein the cutout formed in the flexible printed wiring board includes a first cutout which is positioned closer to the first side wall side than the light source and is arranged along the first side wall and second and third cutouts which are continuously connected with both end portions of the first cutout respectively and are arranged along the second and third side walls.

(3) The present invention is, in the constitution (1) or (2), characterized in that a portion of the flexible printed wiring board which is separated by the cutout is adhered to a back-surface side of the frame-like mold using a pressure-sensitive adhesive double-coated tape.

(4) The present invention is, in any one of the constitutions (1) to (3), characterized in that the frame-like mold includes a recessed portion which opens on the back-surface side of the frame-like mold and into which the light source is inserted.

(5) The present invention is, in any one of the constitutions (1) to (4), characterized in that the flexible printed wiring board is adhered to a back-surface side of the frame-like mold using a pressure-sensitive adhesive double-coated tape.

(6) In a liquid crystal display device which includes a liquid crystal display panel, a backlight which is arranged on a back-surface side of the liquid crystal display panel, and a flexible printed wiring board which has one end thereof connected to a terminal portion of the liquid crystal display panel, the backlight includes a frame-like mold, the flexible printed wiring board is folded and has a portion thereof arranged on a back-surface side of the frame-like mold, the flexible printed wiring board includes an electronic part, the frame-like mold includes a first side wall which is positioned on a side at which the flexible printed wiring board is folded, a second side wall which is positioned on one end side of the first side wall, and a third side wall which is positioned on another end side of the first side wall and oppositely faces the second side wall, and the second side wall of the frame-like mold includes a recessed portion which opens on the back-surface side of the frame-like mold and into which the electronic part is inserted.

(7) The present invention is, in the above-mentioned constitution (6), characterized in that the third side wall of the frame-like mold includes a recessed portion which opens on the back-surface side of the frame-like mold and into which the electronic part is inserted.

(8) The present invention is, in the constitution (6) or (7), characterized in that a plurality of recessed portions is formed at a predetermined interval.

(9) The present invention is, in any one of the constitutions (6) to (8), characterized in that a length of the recessed portion is 10 mm or less when measured in the extending direction of the side wall in which the recessed portion is formed.

(10) The present invention is, in any one of the constitutions (6) to (9), characterized in that a length of the recessed portion is 5 mm or less when measured in the extending direction of the side wall in which the recessed portion is formed.

(11) The present invention is, in any one of the constitutions (6) to (10), characterized in that the backlight includes a light guide body, the second side wall and the third side wall of the frame-like mold, assuming that the recessed portion is not provided, include first to third portions which change frame widths thereof in a step-like manner, the second portion exhibits a larger frame width of the frame-like mold than the first portion, and the third portion exhibits a larger frame width of the frame-like mold than the second portion, the first portion accommodates the liquid crystal display panel therein, the third portion accommodates the light guide body therein, and the recessed portion into which the electronic part is inserted is formed in the third portion.

(12) The present invention is, in any one of the constitutions (6) to (11), characterized in that the back light includes a reflection sheet and the reflection sheet is fixed to the back-surface side of the frame-like mold.

(13) The present invention is, in any one of the constitutions (6) to (12), characterized in that the flexible printed wiring board is adhered to the back-surface side of the frame-like mold using a pressure-sensitive adhesive double-coated tape.

(14) The present invention is, in the above-mentioned constitution (12), characterized in that the flexible printed wiring board is adhered to the frame-like mold at a region outside the reflection sheet in a plan view.

(15) The present invention is, in the above-mentioned constitution (12), characterized in that the reflection sheet includes a cutout portion which exposes a back-surface side of the mold in a portion of a region which is covered with the flexible printed wiring board, and the flexible printed wiring board is adhered to the frame-like mold in the cutout portion.

(16) In a liquid crystal display device which includes a liquid crystal display panel, a backlight which is arranged on a back-surface side of the liquid crystal display panel, and a flexible printed wiring board which has one end thereof connected to a terminal portion of the liquid crystal display panel, the backlight includes a frame-like mold and a light source, the flexible printed wiring board is folded outside a frame of the frame-like mold and has a portion thereof arranged on a back-surface side of the frame-like mold, the frame-like mold includes a first side wall which is positioned on a side at which the flexible printed wiring board is folded, a second side wall which is positioned on one end side of the first side wall, and a third side wall which is positioned on another end side of the first side wall and oppositely faces the second side wall, the light source is accommodated in the inside of the frame of the frame-like mold; and the light source is mounted on a surface which oppositely faces the liquid crystal display panel in a state that the flexible printed wiring board is folded out of surfaces of the flexible printed wiring board in the vicinity of a bent portion of the flexible printed wiring board, the flexible printed wiring board includes an electronic part, the flexible printed wiring board has a cutout therein in a periphery of the light source, the second side wall of the frame-like mold includes a recessed portion which opens at a back-surface side of the frame-like mold and into which the electronic part is inserted.

(17) The present invention is, in the above-mentioned constitution (16), characterized in that the cutout formed in the flexible printed wiring board includes a first cutout which is positioned closer to the first side wall side than the light source and is arranged along the first side wall and second and third cutouts which are continuously connected with both end portions of the first cutout respectively and are arranged along the second and third side walls.

(18) The present invention is, in the constitution (16) or (17), characterized in that a portion of the flexible printed wiring board which is separated by the cutout is adhered to a back-surface side of the frame-like mold using a pressure-sensitive adhesive double-coated tape.

(19) The present invention is, in any one of the constitutions (16) to (18), characterized in that the frame-like mold includes a recessed portion which opens at the back-surface side of the frame-like mold and into which the light source is inserted.

(20) The present invention is, in any one of the constitutions (16) to (19), characterized in that the third side wall of the frame-like mold includes a recessed portion which opens at the back-surface side of the frame-like mold and into which the electronic part is inserted.

(21) The present invention is, in any one of the constitutions (16) to (20), characterized in that a plurality of recessed portions into which the electronic parts are inserted is formed at a predetermined interval.

(22) The present invention is, in any one of the constitutions (16) to (21), characterized in that a length of the recessed portion into which the electronic part is inserted is 10 mm or less when measured in the extending direction of the side wall in which the recessed portion into which the electronic part is inserted is formed.

(23) The present invention is, in any one of the constitutions (16) to (22), characterized in that a length of the recessed portion into which the electronic part is inserted is 5 mm or less when measured in the extending direction of the side wall in which the recessed portion into which the electronic part is inserted is formed.

(24) The present invention is, in any one of the constitutions (16) to (23), characterized in that the backlight includes a light guide body, the second side wall and the third side wall of the frame-like mold, assuming that the recessed portion into which the electronic part is inserted is not provided, include first to third portions which change frame widths thereof in a step-like manner, the second portion exhibits a larger frame width of the frame-like mold than the first portion, and the third portion exhibits a larger frame width of the frame-like mold than the second portion, the first portion accommodates the liquid crystal display panel therein, the third portion accommodates the light guide body therein, and the recessed portion into which the electronic part is inserted is formed in the third portion.

(25) The present invention is, in any one of the constitutions (16) to (24), characterized in that the back light includes a reflection sheet and the reflection sheet is fixed to the back-surface side of the frame-like mold.

(26) The present invention is, in any one of the constitutions (16) to (25), characterized in that the flexible printed wiring board is adhered to the back-surface side of the frame-like mold using a pressure-sensitive adhesive double-coated tape.

(27) The present invention is, in the above-mentioned constitution (25), characterized in that the flexible printed wiring board is adhered to the frame-like mold at a region outside the reflection sheet in a plan view.

(28) The present invention is, in the above-mentioned constitution (25), characterized in that the reflection sheet includes a cutout portion which exposes a back-surface side of the mold in a portion of a region which is covered with the flexible printed wiring board, the flexible printed wiring board is adhered to the frame-like mold in the cutout portion.

Here, the constitutions (1) to (28) merely constitute one example and various modifications can be made without departing from the technical concept of the present invention.

To briefly explain advantageous effects obtained by the typical inventions among the inventions disclosed in this specification, they are as follows.

That is, according to the liquid crystal display device of the present invention, it is possible to realize the miniaturization and the reduction of thickness of the liquid crystal display device.

DESCRIPTION OF THE PREFERRED EMBODIMENT

Hereinafter, an embodiment of the present invention is explained in detail in conjunction with drawings.

Here, in all drawings for explaining the embodiments, parts having identical functions are given same symbols and their repeated explanation is omitted.

A liquid crystal display module of the embodiment of the present invention is a TFT-system liquid crystal display module having a miniaturized liquid crystal panel with the sub pixel number of approximately 240×320×3 in color display and is used as a display part of a portable equipment such as a mobile phone.

Embodiment 1

Figure 1A:
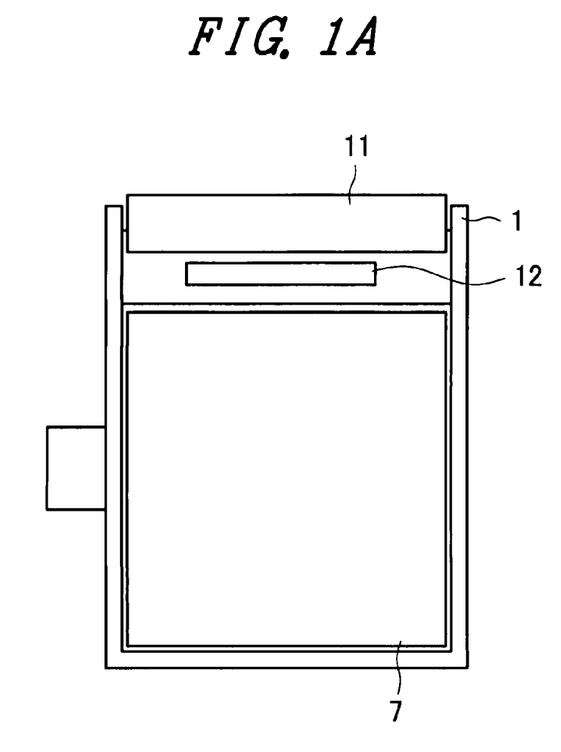
FIG. 1A to FIG. 1C are views showing a liquid crystal display module of an embodiment 1 of the present invention.
Figures 1B, 1C:
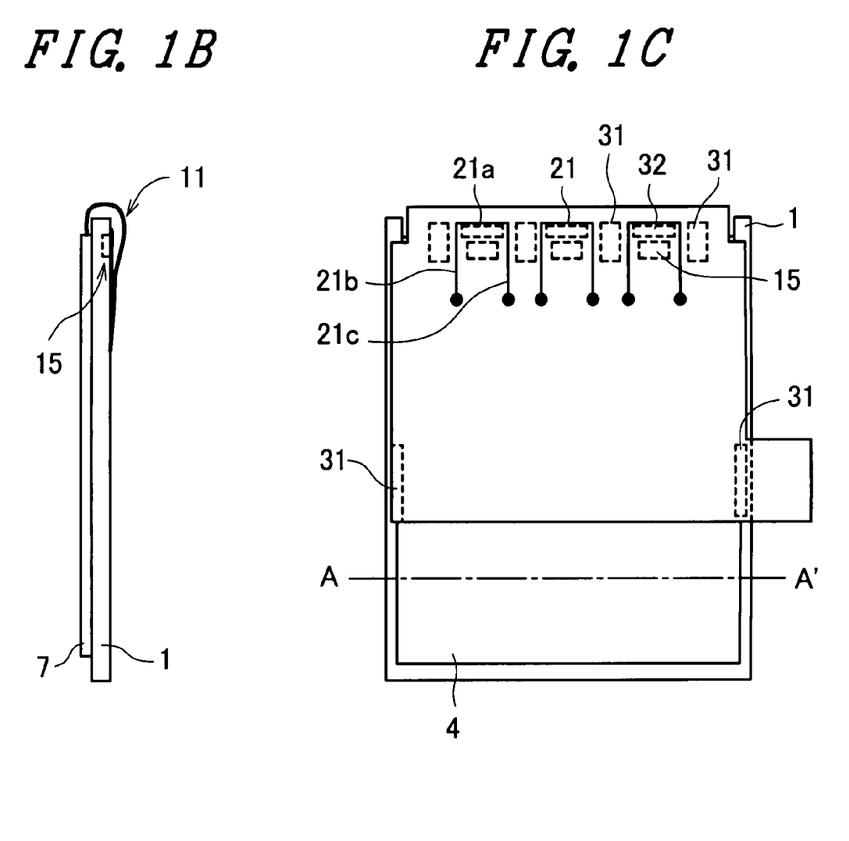
Figure 2:
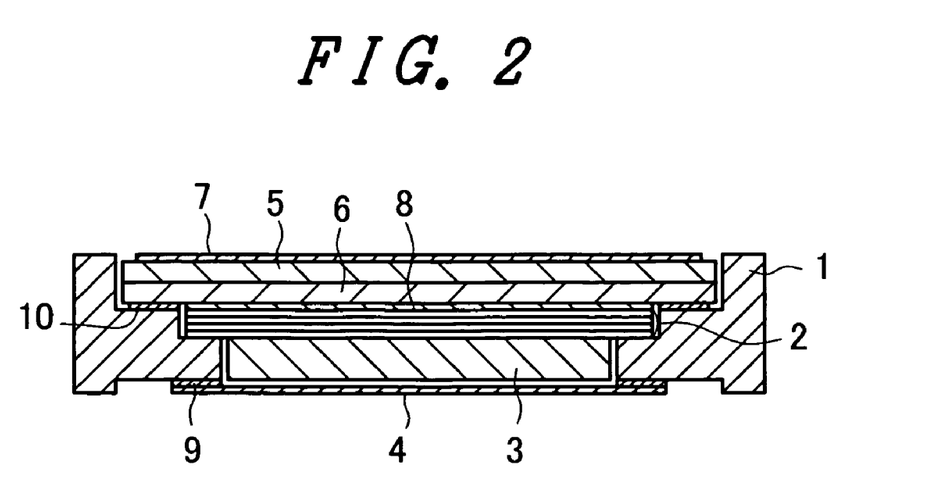
FIG. 2 is a cross-sectional view showing a cross-sectional structure taken along a line A-A' in FIG. 1C.

FIG. 1A to FIG. 1C are views showing the liquid crystal display module of the embodiment 1, wherein FIG. 1A is a view as viewed from an upper side (a liquid crystal display panel side, a front-face side, a viewer's side), FIG. 1B is a view as viewed from a side, and FIG. 1C is a view as viewed from a lower side (a light guide plate side, back-surface side or a back side). Further, FIG. 2 is a cross-sectional view showing the cross-sectional structure taken along a line A-A' in FIG. 1C.

In this embodiment, the backlight includes an optical sheet group 2 which is constituted of a lower diffusion sheet, two lens sheets, an upper diffusion sheet, a light guide plate 3, a reflection sheet 4 which is arranged below the light guide plate (a light guide body) 3, and a white light emitting diode 15 which is arranged on a side surface of the light guide plate 3. The backlight of this embodiment is constituted by arranging the optical sheet group 2, the light guide plate 3 and the reflection sheet 4 in the inside of the mold 1 in order shown in FIG. 2.

The liquid crystal display panel is constituted as follows. A glass substrate on which pixel electrodes, thin film transistors and the like are formed (also referred to as a TFT substrate, an active matrix substrate) 6 and a glass substrate on which color filters and the like are formed (also referred to as a counter substrate) 5 are overlapped to each other with a predetermined gap therebetween. Both substrates are adhered to each other by a frame-like sealing material which is formed between both substrates in the vicinity of peripheral portions of both substrates and, at the same time, liquid crystal is filled and sealed in the inside of the sealing material between both substrates from a liquid crystal sealing port formed in a portion of the sealing material. Further, polarizers (7, 8) are adhered to outsides of both substrates.

In this manner, the liquid crystal display module adopts the structure in which the liquid crystal is sandwiched between a pair of substrates. Here, a material of the substrates may be any material which can form an insulating substrate. That is, the material of the substrates is not limited to glass and may be plastic or the like. Further, the color filters may be formed on the TFT substrate side in place of the counter substrate side. In a monochroic liquid crystal display panel, color filters are unnecessary. In a liquid crystal display device which adopts a field sequential system, color filters are not formed and a three-color light source may be used in place of a white light emitting diode.

A counter electrode may be formed on the counter substrate side when the liquid crystal display panel is a liquid crystal display panel which adopts a TN system or a VA system. When the liquid crystal display panel adopts an IPS system, the counter electrode is formed on the TFT substrate side.

Here, the present invention is irrelevant to the inner structure of the liquid crystal panel and hence, the explanation of the detail of the inner structure of the liquid crystal panel is omitted. Further, the present invention is applicable to the liquid crystal panel having any structure.

In the liquid crystal display module of this embodiment, white light emitting diodes 15 for a backlight are mounted on a FPC and, at the same time, the FPC 11 is folded back and is wrapped around a back surface of the backlight and is fixed to the back-surface side of the mold 1 using a pressure sensitive adhesive double coated tape 31. Here, the FPC 11 is folded outside a frame of the frame-like mold 1. Then, the white light emitting diodes 15 are mounted on a surface of the FPC 11 which faces the liquid crystal display panel in an opposed manner in a state that the FPC 11 is folded in the vicinity of a folded portion of the FPC 11 and, at the same time, the white light emitting diodes 15 are accommodated in the inside of the frame of the mold 1. Here, although not shown in the drawing, in the frame-like mold 1, recessed portions which open at the back-surface side are formed in the back-surface side, and the white light emitting diodes 15 are inserted into the recessed portions.

This embodiment is configured such that in a region of the FPC 11 on which the white light emitting diodes 15 are mounted, cutouts 21 are formed in peripheries the white light emitting diodes 15. Here, the cutout is constituted of a first portion (a first cutout) 21a, a second portion (a second cutout) 21b and a third portion (a third cutout) 21c.

The first portion 21a of the cutout 21 is formed on a sidewall (a first side wall of the present invention) side which is positioned closer to a side (a short side in the drawing) at which the FPC 11 of the frame-like mold 1 is folded than the white light emitting diode 15 along the short-side side wall. Further, the second portion 21b and the third portion 21c are connected with both end portions of the first portion 21a and are formed along two long-side side walls (the second side wall and the third side wall of the present invention) which are positioned at both ends on the respective short-side side walls.

Further, a portion which is separated from the FPC 11 by the cutout 21 is adhered to a back-surface-side surface of the frame-like mold 1 using a pressure sensitive adhesive double coated tape 32. Here, the position of the pressure sensitive adhesive double coated tape 32 may be set at a front side, a rear side, a left side and a right side of the white light emitting diodes 15.

According to this embodiment, due to the cutout 21, out of the FPC 11, a region around the white light emitting diodes 15 is partially separated from the folded portion of the FPC 11 and is fixed to the back-surface-side surface of the frame-like mold 1 and hence, the adhesion of the FPC 11 is hardly directly influenced by the spring-back of the whole FPC 11. Accordingly, it is possible to prevent the floating of the white light emitting diodes 15 thus preventing a drawback that the brightness is lowered whereby the white light emitting diodes 15 can obtain the stable brightness.

Further, assuming that the displacement of the white light emitting diodes 15 from the proper position can be prevented for avoiding the influence of the spring-back of the FPC 11, it is possible to minimize the radius of curvature of the FPC 11 and hence, it is possible to set a profile size of the liquid crystal display module to a minimum size.

Then, by adopting the structure which allows the folding of the FPC 11 with the minimum radius, an area of the whole FPC can be reduced and hence, a cost can be reduced. Further, by fixing the FPC 11 using only the pressure sensitive adhesive double coated tape, a mechanical part such as a metal plate becomes unnecessary and a cost can be reduced.

Here, the above-mentioned respective patent documents disclose a technique to form the cutouts in the FPC. However, these patent documents fail to disclose the prevention of the displacement of the white light emitting diodes 15 from the proper position by avoiding the influence of the spring-back of the FPC 11.

Embodiment 2

Figure 3A:
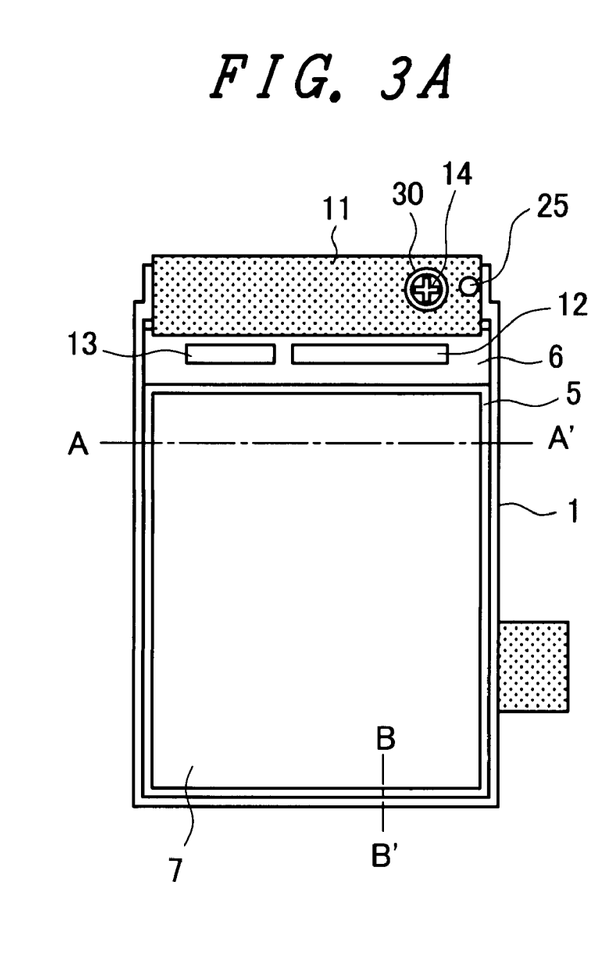
FIG. 3A and FIG. 3B are views showing a liquid crystal display module of an embodiment 2 of the present invention.
Figure 3B:
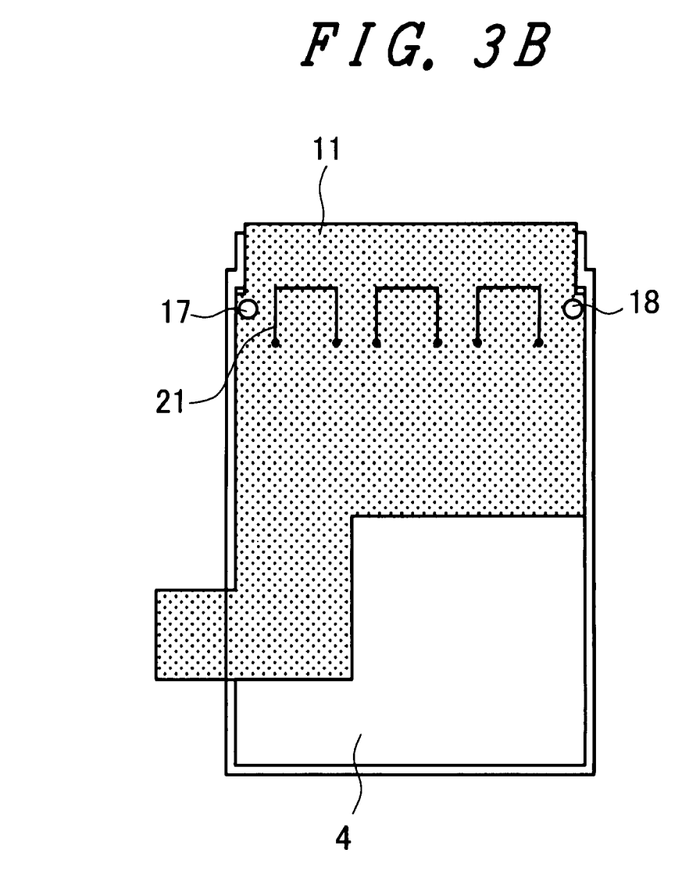
Figure 4A:
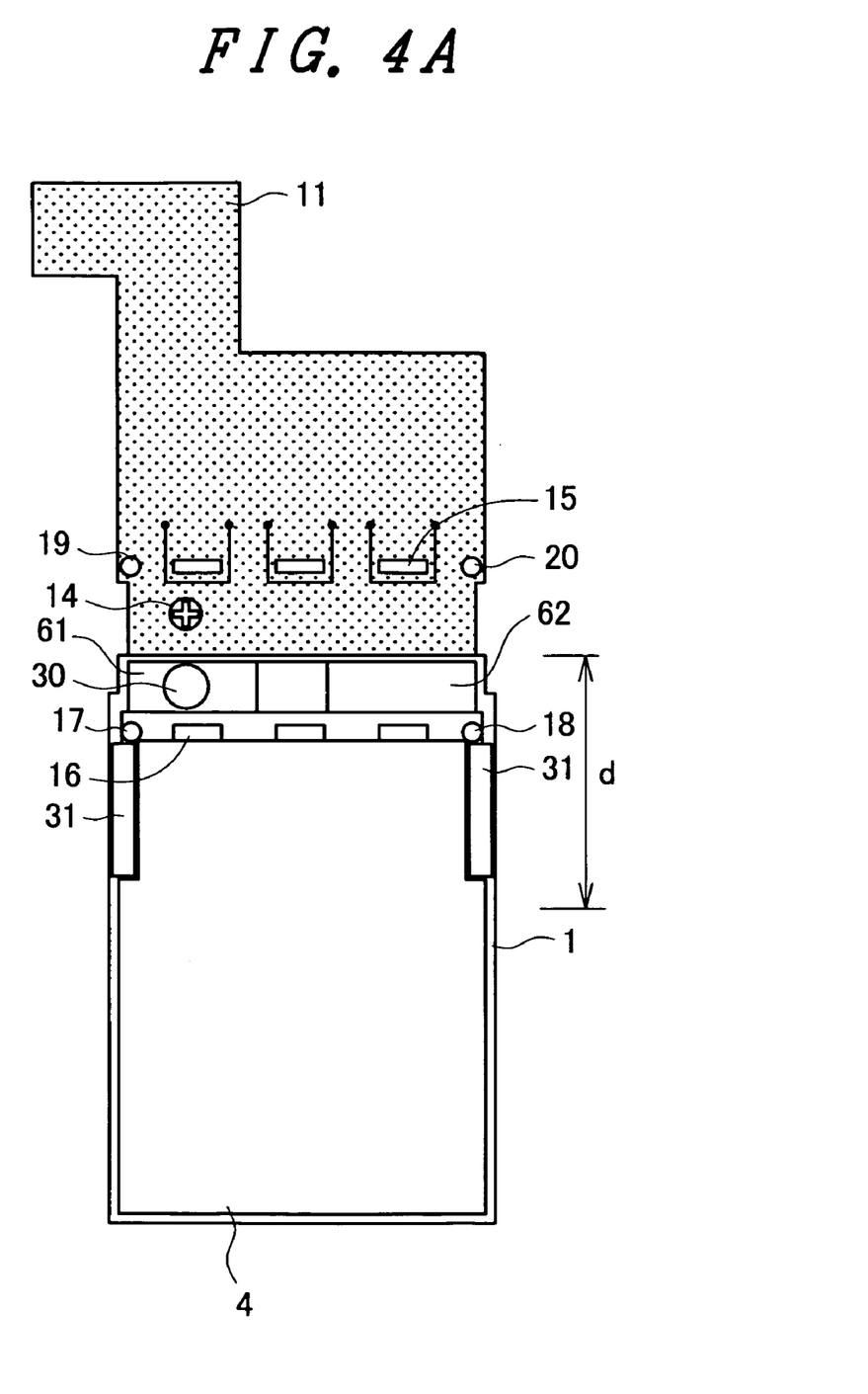
FIG. 4A is a view showing a state in which an FPC is developed in FIG. 3B.

FIG. 3A and FIG. 3B are views showing a liquid crystal display module of the embodiment 2 of the present invention, wherein FIG. 3A is a view as viewed from an upper side (a liquid crystal display panel side, a front-face side, a viewer's side), and FIG. 3B is a view as viewed from a lower side (a light guide plate side, a back-surface side or a back side). Further, FIG. 4A is a view showing a state in which the FPC 11 is developed in FIG. 3B.

Also in the liquid crystal display module of this embodiment, in the same manner as the embodiment 1, white light emitting diodes 15 for a backlight are mounted on a FPC 11 and, at the same time, the FPC 11 is folded back and is wrapped around a back surface of the backlight and is fixed to the back-surface side of the mold 1 using a pressure sensitive adhesive double coated tape 31. Here, the FPC 11 is folded outside a frame of the frame-like mold 1. Then, the white light emitting diodes 15 are mounted on a surface of the FPC 11 which faces the liquid crystal display panel in an opposed manner in a state that the FPC 11 is folded in the vicinity of a folded portion of the FPC 11 and, at the same time, the white light emitting diodes 15 are accommodated in the inside of the frame of the mold 1. In the frame-like mold 1, recessed portions 16 which open at the back-surface side are formed in the back-surface side and the white light emitting diodes 15 are inserted into the recessed portions 16.

Further, in the same manner as the above-mentioned embodiment, the embodiment is configured such that in a region of the FPC 11 on which the white light emitting diodes 15 are mounted, cutouts 21 are formed in peripheries the white light emitting diodes 15. Here, the cutout is constituted of a first portion 21a, a second portion 21b and a third portion 21c.

Further, although not shown in the drawing, portions which are separated from the FPC 11 by the cutouts 21 are adhered to the back-side surface of the frame-like mold 1 by pressure sensitive adhesive double coated tapes (see 32 in FIG. 1C).

Also in this embodiment, due to the cutout 21, out of the FPC 11, a region around the white light emitting diodes 15 is partially separated from the folded portion of the FPC 11 and is fixed to the back-surface-side surface of the frame-like mold 1 and hence, the adhesion of the FPC 11 is hardly directly influenced by the spring-back of the whole FPC 11. Accordingly, it is possible to prevent the floating of the white light emitting diodes 15 thus preventing a drawback that the brightness is lowered whereby the white light emitting diodes 15 can obtain the stable brightness.

Further, also in this embodiment, it is possible to minimize the radius of curvature of the FPC 11 and hence, it is possible to set a profile size of the liquid crystal display module to a minimum size whereby an area of the whole FPC can be reduced and hence, a cost can be reduced.

Further, by fixing the FPC 11 using only the pressure sensitive adhesive double coated tape, a mechanical part such as a metal plate becomes unnecessary and a cost can be reduced.

Figure 5:
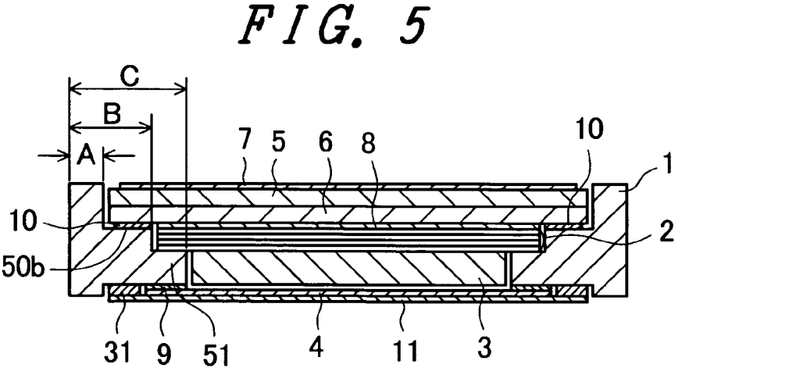
FIG. 5 is a cross-sectional view showing a cross-sectional structure taken along a line A-A' in FIG. 3A.
Figure 6:
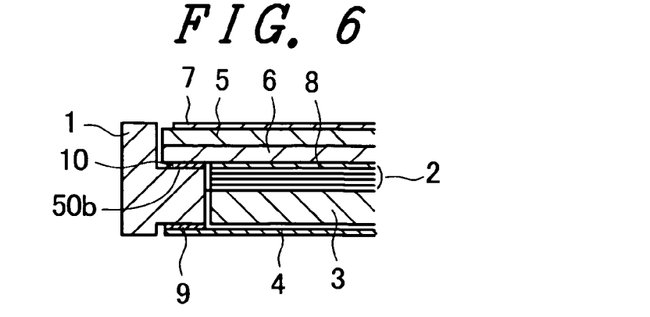
FIG. 6 is a cross-sectional view showing a cross-sectional structure taken along a line B-B' in FIG. 3A.

FIG. 5 is a cross-sectional view showing the cross-sectional structure taken along a line A-A' in FIG. 3A, and FIG. 6 is a cross-sectional view showing the cross-sectional structure taken along a line B-B' in FIG. 3A.

In this embodiment, in the same manner as the above-mentioned embodiments, the backlight includes an optical sheet group 2 which is constituted of a lower diffusion sheet, two lens sheets, an upper diffusion sheet, a light guide plate 3, a reflection sheet 4 which is arranged below the light guide plate (a light guide body) 3, and a white light emitting diode 15 which is arranged on a side surface of the light guide plate 3.

Here, the optical sheet group 2 is not limited to the four-sheet constitution of this embodiment. For example, the present invention may adopt the constitution which uses only one diffusion sheet instead of using two diffusion sheets. Further, the present invention may use only one lens sheet (prism sheet) instead of using two lens sheets. Further, by allowing the light guide plate 3 to perform also a function of the lens sheet by forming grooves in the light guide plate 3, it is possible to eliminate the lens sheet. Accordingly, the optical sheet group 2 may be formed of one optical sheet. Further, it may be possible to use the optical sheets other than the diffusion sheet and the lens sheet. As can be understood from above, the optical sheet group 2 may be replaced with at least one optical sheet.

Further, the white light emitting diode 15 is mounted on the FPC 11 and is arranged in the inside of the recessed portion 16 formed on the frame-like mold 1. Here, the reflection sheet 4 is adhered (or stuck) or fixed to the mold using the pressure sensitive adhesive double coated tape (adhering member) 9.

Figure 7A:
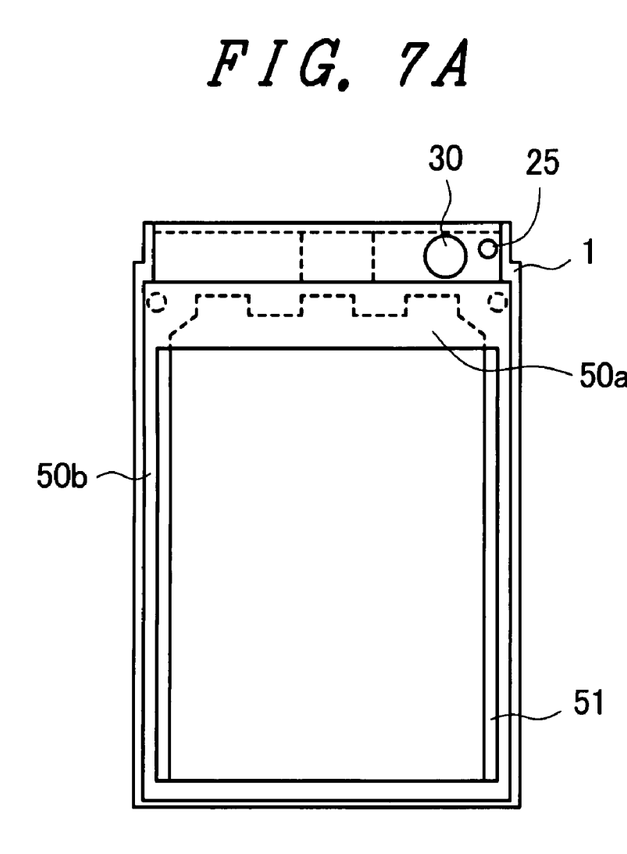
FIG. 7A and FIG. 7B are views for explaining a shape of a mold shown in FIG. 5.
Figure 7B:
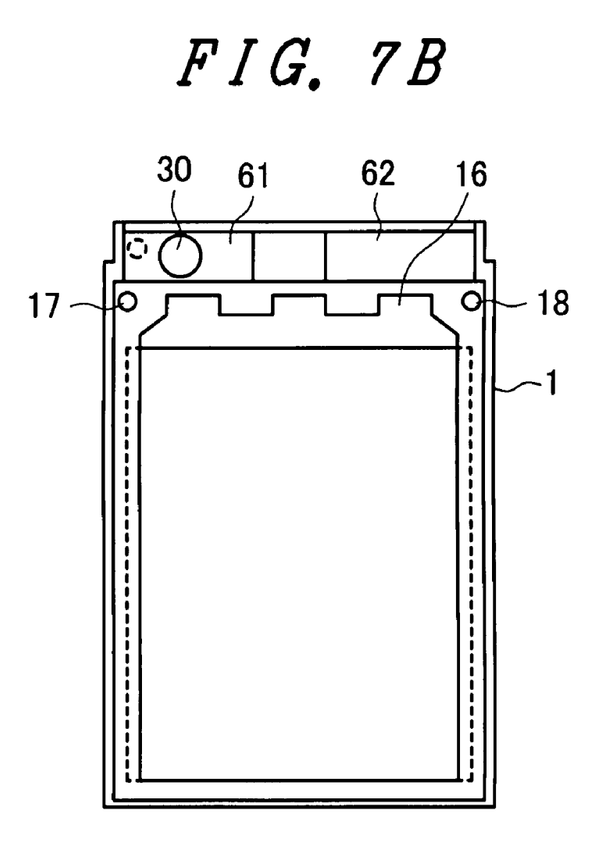

FIG. 7A and FIG. 7B are views for explaining a shape of the mold shown in FIG. 5, wherein FIG. 7A is a view which views the mold shown in FIG. 5 from above (liquid crystal display panel side) and FIG. 7B is a view which views the mold shown in FIG. 5 from a lower side (light guide plate side).

As shown in FIG. 7A and FIG. 7B, the mold 1 of this embodiments adopts the structure in which a bottom surface is cut off and an opening portion is formed in a center portion thereof, that is, a frame-like body (or cylindrical body) having an approximately quadrangular cross-sectional shape. Accordingly, the reflection sheet 4 is adhered to a back-surface side of the frame-like mold 1.

This embodiment and the previously-mentioned embodiment 1 adopt the structure which allows a frame width of the mold 1 around the light guide plate 3 to approach the light guide plate by increasing a thickness of a wall of the mold 1 or the like. That is, in this embodiment and the previously mentioned embodiment 1, two sides of the mold 1 (preferably long sides of the mold 1) (sides perpendicular to an incident surface of the light guide plate 3) include a first to third portions which change a distance between the side and an opposing side in a step-like manner.

Here, the distance between the second portion (the portion indicated by B in FIG. 5) and the opposing side is set smaller than the distance between the first portion (the portion indicated by A in FIG. 5) and the opposing side and, while the distance between the third portion (the portion indicated by C in FIG. 5) and the opposing side is set smaller than the distance between the second portion and the opposing portion. Further, a first stepped portion (50b) is formed of the first portion A and the second portion B.

The liquid crystal display panel has a peripheral portion of the lower glass substrate 6 supported and fixed to the stepped portion 50b of the mold 1 by the pressure sensitive adhesive double coated tape (adhering member) 10.

Further, a second stepped portion 51 is formed of the second portion B and the third portion C and the optical sheet group 2 is supported on the stepped portion 51.

Further, the light guide plate 3 is arranged inside the third portion C.

The reflection sheet 4 is arranged below the light guide plate 3 so as to cover an opening portion of the mold 1.

Further, in this embodiment, an end portion of the lower polarizer 8 is positioned in the inside of the second stepped portion 51. That is, as viewed in a plan view, the end portion of the lower polarizer 8 is configured to be overlapped to the second stepped portion 51.

Here, in this embodiment, as a method which approaches the inner wall of the mold 1 to the light guide plate 3, either one of the method which partially increases the wall thickness of the mold 1 and a method which moves a wall position to the inside while maintaining the same frame width may be adopted.

From a viewpoint of durability, as shown in FIG. 5, it is preferable that the second portion B exhibits the larger frame width of the frame-like mold 1 than the first portion A, and the third portion C exhibits the larger frame width of the frame-like mold 1 than the second portion B.

By accommodating the liquid crystal display panel in the first portion A and by accommodating the light guide plate 3 in the third portion C, it is possible to reduce an area of the light guide plate 3. Even assuming that the brightness of the white light emitting diode 15 is held equal, when the area of a light radiation surface of the light guide plate 3 (an upper surface of the light guide plate 3) is reduced, the brightness per unit area is increased. Accordingly, it is possible to obtain the backlight with high brightness according to this embodiment.

In this manner, according to this embodiment, it is possible to enhance the brightness compared to the conventional structure while realizing the reduction of thickness of the liquid crystal display module.

Here, in this embodiment, the optical sheet group 2 which is supported on the stepped portion 51 may be formed of at least one optical sheet.

Figure 8:
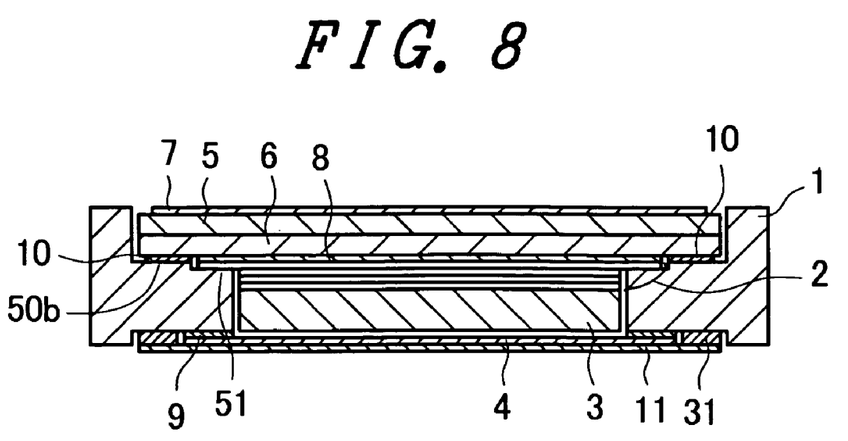
FIG. 8 is a cross-sectional view of an essential part showing a modification of a liquid crystal display module of the embodiment 2 of the present invention.

FIG. 8 is a cross-sectional view of an essential part showing a modification of the liquid crystal display module of the embodiment of the present invention.

For example, as shown in FIG. 8, the upper diffusion sheet among the optical sheet group 2 is supported on the stepped portion 51, and other optical sheets (two lens sheets, the lower diffusion sheet) may be arranged on the light guide plate 3 inside the third portion.

Here, as shown in FIG. 8, the upper diffusion sheet among the optical sheet group 2 is supported on the stepped portion 51 for preventing the intrusion of dusts or the like into the inside of the third portion C.

Here, the constitution of the optical sheet group 2 is not limited to the above-mentioned constitution. That is, it is sufficient that at least one optical sheet is arranged on the stepped portion 51 and the number of optical sheets which are arranged inside the third portion C is not particularly limited.

While the embodiments explained in conjunction with FIG. 5 and FIG. 8 describe the structure related to the long sides of the frame-like mold 1, the third portion C may not be formed on the short side of the mold 1 as shown in FIG. 6. Here, out of the short sides of the mold 1, on the side where the white light emitting diode 15 is arranged, the stepped portion 50a is formed in the same manner as the stepped portion 50b. The stepped portion 50a is set to have the larger width than the stepped portion 50b and the white light emitting diode 15 is accommodated in a back side of the stepped portion 50a.

Also in this embodiment, the FPC 11 wraps around (by folding) a back-surface side of a backlight and is fixed to the back-surface side. Here, in pulling the FPC 11 around the back surface of the backlight and fixing the FPC 11 to the back-surface side, at least some of electronic parts which are mounted on the FPC 11 may be accommodated in the mold 1.

That is, as shown in FIG. 7B, recessed portions (61, 62) which have lower sides (back-surface sides) thereof opened are formed in the mold 1, and at least some of the electronic parts which are mounted on the FPC 11 may be accommodated in these recessed portions (61, 62). Here, although FIG. 7B shows the case in which the recessed portions (61, 62) having bottom portions constitute electronic parts accommodating portions, the bottom portions are not indispensable in constitution and hence, a frame-like portion having no bottom portion (through hole) may be also used as the electronic parts accommodating portion.

The electronic parts which are mounted on the FPC 11 include an electronic part whose setting is adjustable (for example, a semi-fixed resistance element 14 for Vcom adjustment which serves to adjust the setting of a reference voltage (or a counter electrode voltage) Vcom of the liquid crystal display panel).

In this embodiment, in pulling the FPC 11 around the back-surface side of the backlight and fixing the FPC 11 to the back-surface side, a through hole 30 is formed in the FPC 11 at a position above the semi-fixed resistance element for Vcom adjustment 14. When the electronic parts accommodating portion of the mold 1 includes the bottom portion, the through hole 30 is also formed in the mold 1. Here, when the electronic parts accommodating portion of the mold 1 is formed in a frame shape having no bottom portion, the electronic parts accommodating portion per se plays a role of the through hole. Accordingly, as shown in FIG. 3A, when the liquid crystal display device is viewed from the liquid crystal display panel side, the electronic part whose setting is adjustable (the semi-fixed resistance element for Vcom adjustment 14) is arranged at a position deeper than the through hole 30 formed in the FPC 11 and, at the same time, at a position where the electronic part is overlapped to the through hole 30.

Accordingly, even in an assembly completion state of the liquid crystal display module, the semi-fixed resistance element for Vcom adjustment 14 is configured to be adjustable. Further, an operator can display an image on the liquid crystal display panel and can adjust the semi-fixed resistance element 14 by watching the image and hence, the liquid crystal display module also can obtain an advantage that the adjustment is facilitated. Further, since the electronic part whose setting is adjustable is positioned deeper than the through hole 30 formed in the FPC 11, there is no possibility that the electronic part projects from the front surface side thus realizing the reduction of the thickness of the liquid crystal display module.

As described above, the liquid crystal display module for a mobile phone increasingly adopts the structure in which the FPC 11 wraps around the back-surface side of the backlight and is fixed to the back-surface side. However, when the FPC 11 wraps around the back side of the backlight from the terminal portion of the liquid crystal display panel with a minimum radius, the FPC 11 exhibits a strong spring-back force and hence, it is necessary to carefully hold the FPC 11.

This embodiment focuses on regions where the reflection sheet 4 is fixed and uses such regions also for fixing the FPC 11.

Figure 4B:
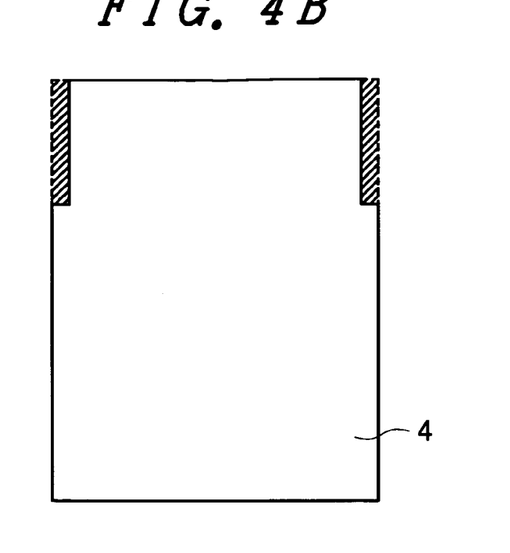
FIG. 4B is a view for explaining a reflection sheet shown in FIG. 4A.

FIG. 4B is a view for explaining the reflection sheet 4 shown in FIG. 4A. As shown in FIG. 4B, the reflection sheet 4 of this embodiment has cutout portions through which the back-surface side of the mold 1 is exposed in some portions of regions thereof which are covered with the FPC 11 (parts indicated by shadow in FIG. 4B). Then, as shown in FIG. 4A, to the front surface of the mold 1 which is exposed through the cutout portions, the FPC 11 is adhered and fixed by way of pressure sensitive adhesive double coated tapes (adhering members) 31.

Further, projecting portions (17, 18) are formed on the back-surface side of the mold 1, while through holes (19, 20) into which these projecting portions (17, 18) are inserted are formed in the FPC 11. Due to such a constitution, it is possible to facilitate the positioning of the FPC 11.

Further, in this embodiment, by inserting the projecting portions (17, 18) of the mold 1 into the through holes (19, 20) of the FPC 11, it is possible to reduce the spring-back force of the FPC 11.

Here, in this embodiment, as shown in FIG. 3A, a projecting portion 25 is formed on a liquid-crystal-display-panel side of the mold 1, and the projecting portion 25 is inserted into a through hole formed in the FPC 11 thus positioning the FPC 11.

In this manner, according to this embodiment, the FPC 11 is not fixed to the reflection sheet 4 by way of a pressure sensitive adhesive double coated tape or an adhering member and hence, it is possible to reduce brightness irregularities attributed to wrinkles or the like of the reflection sheet 4 in a high-temperature environment or a temperature-changing environment.

Further, by avoiding the reflection sheet 4, it is possible to prevent the thickness of the pressure sensitive adhesive double coated tape 31 which adheres and fixes the FPC 11 to the mold 1 from influencing a total thickness of the liquid crystal display module. Accordingly, a tape having a strong adhesive force may be selected as the pressure sensitive adhesive double coated tape 31 so as to prevent the center portion of the FPC 11 from being bulged.

Due to such a constitution, this embodiment can realize the miniaturization and the reduction of thickness of the liquid crystal display module for mobile phone.

In the present invention, by adhering the FPC 11 to the back-surface side of the mold 1., it is possible to suppress the bulging of the FPC 11 compared to a case in which the FPC 11 is adhered to a side surface of the mold 1. Further, as shown in FIG. 4B and FIG. 5, by adhering the FPC 11 to the back-surface side of the mold 1 at a position where the FPC 11 is not overlapped to the reflection sheet 4, it is possible to reduce a thickness of the liquid crystal display module by an amount corresponding to thicknesses of the reflection sheet 4 and the pressure sensitive adhesive double coated tape 9 for adhering the reflection sheet 4. Due to such a constitution, it is possible to use a pressure sensitive adhesive double coated tape 31 for adhering the FPC 11 having a thickness larger than the thickness of the pressure sensitive adhesive double coated tape 9 for adhering the reflection sheet 4 whereby a fixing force can be increased to cope with the spring-back force of the FPC 11.

Further, since the FPC 11 is not adhered to the reflection sheet 4, the constitution also can obtain an advantage that the deformation of the reflection sheet 4 can be prevented. Here, it must be noted that only portions where the adhesion is performed (portions where the adhering member is arranged) are described heretofore and hence, the reflection sheet 4 and the FPC 11 define regions where the reflection sheet 4 and the FPC 11 are overlapped to each other.

Here, in the frame-like mold 1, assuming a side wall which is positioned on a side at which the FPC 11 is folded as a first side wall, a side wall which is positioned on one end side of the first side wall as a second side wall, and a side wall which is positioned on another end side of the first side wall and faces the second side wall as a third side wall, it is favorable that regions where the FPC 11 is adhered to the back-surface side of the mold 1 (regions where the pressure sensitive adhesive double coated tapes 31 are provided) have a shape in which a size in the direction perpendicular to the folding side is set larger than a size in the direction parallel to the above-mentioned folding side. That is, it is favorable that the pressure sensitive adhesive double coated tape 31 has a shape which is elongated in the extending direction of the FPC 11. This is because that the spring-back force of the FPC 11 strongly acts in the direction approaching the folding side in the portions where the pressure sensitive adhesive double coated tapes 31 are provided in FIG. 4A.

In FIG. 4A, the cutout portions are formed in the reflection sheet 4 and hence, this embodiment can obtain an advantage that it is possible to allow the pressure sensitive adhesive double coated tapes 31 to have a wide width. However, when the mold 1 has the wide frame width as explained in conjunction with FIG. 5 and FIG. 8, it is unnecessary to form the cutout portions in the reflection sheet 4. In this case, it is possible to use the reflection sheet 4 having an approximately rectangular shape.

Here, FIG. 5 illustrates the constitution in which the reflection sheet 4 is adhered to the mold 1 by the pressure sensitive adhesive double coated tape 9 also in peripheries of the cutout portions. However, the present invention is not limited to such a constitution. For example, the liquid crystal display device may be constituted as follows. That is, in peripheral portions of the cutout portions and region of the reflection sheet 4 positioned closer to the folding side than the peripheries of the cutout portions (a region within a distance from the folding side in FIG. 4A equal to or less than a distance "d"), a region where the reflection sheet 4 is adhered to the mold 1 is not formed. In this case, the reflection sheet 4 is not adhered to the mold 1 in the region within the distance from the folding side equal to or less than "d". However, the reflection sheet 4 is covered with the FPC 11 to compensate for such a constitution and hence, there arises no problems particularly. Accordingly, the present invention is applicable to the liquid crystal display module even when the space to which the reflection sheet 4 is adhered is not sufficiently ensured (for example, when the mold 1 has a small frame width). It is needless to say that the present invention is applicable to the mold 1 having the large frame width as explained in conjunction with FIG. 5 and FIG. 8.

Such an idea is also applicable when the reflection sheet 4 does not have the cutout portions. To generalize this idea, the liquid crystal display module may be configured such that in the region along the long side of the reflection sheet 4, the region which is arranged within the distance from the folding side larger than the distance "d" includes a region where the reflection sheet 4 is adhered to the mold 1, while in the region along the long side of the reflection sheet 4, the region which is arranged within the distance from the folding side smaller than the distance "d" does not have a region where the reflection sheet 4 is adhered to the mold 1 and the reflection sheet 4 is covered with the FPC 11. Due to such constitution, the present invention is applicable to the liquid crystal display module even when the space to which the reflection sheet 4 is adhered is not sufficiently ensured (for example, when the mold 1 has the small frame width as shown in FIG. 7 and FIG. 9). Here, instead of the constitution which eliminates the pressure sensitive adhesive double coated tapes 9 in the regions within the distance from the folding side smaller than the distance "d", it may be possible to adopt the constitution in which the pressure sensitive adhesive double coated tapes 9 having a width smaller than a width of the pressure sensitive adhesive double coated tapes 9 used in the regions within the distance from the folding side larger than the distance "d" may be used in the region having the distance from the folding side smaller than the distance "d".

Embodiment 3

In the above-mentioned embodiment 2, the electronic parts such as the resisters and capacitors and the like are mounted on the surface of the FPC 11 which faces the liquid crystal display panel in an opposed manner and, at the same time, at the portion of the mold 1 which is positioned on the side where FPC 11 is folded, the electronic parts are accommodated inside the mold 1.

Accordingly, with respect to the structure of the above-mentioned embodiment 2, it is necessary to ensure the accommodating space for electronic parts in the inside of the mold and hence, a planner size of the liquid crystal display device as whole is increased.

This embodiment is provided for overcoming such a drawback.

Figure 9A:
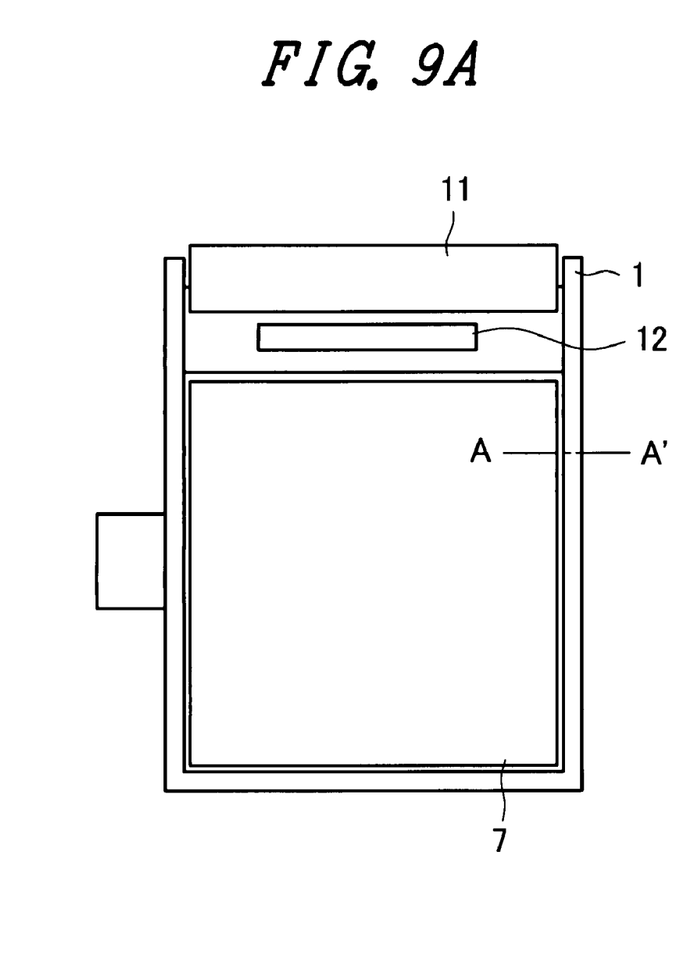
FIG. 9A and FIG. 9B are views showing a liquid crystal display module of the embodiment 3 of the present invention.
Figure 9B:
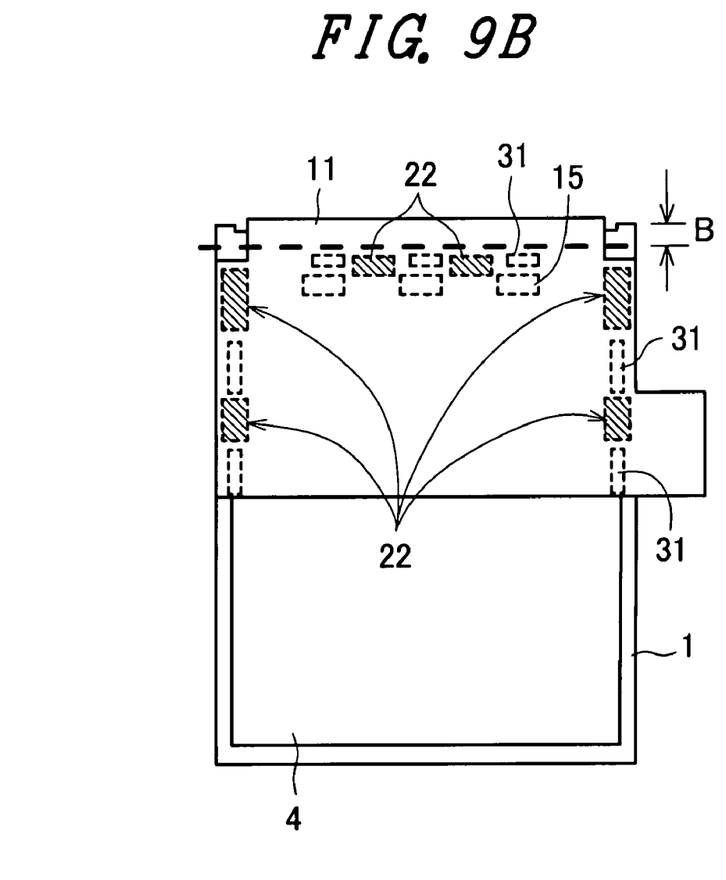

FIG. 9A and FIG. 9B are views showing the schematic constitution of a liquid crystal display module of the embodiment 3 of the present invention, wherein FIG. 9A is a view as viewed from an upper side (a liquid crystal display panel side, a front-face side, a viewer's side), and FIG. 9B is a view as viewed from a lower side (a light guide plate side, a back-surface side or a back side).

Also in the liquid crystal display module of this embodiment, white light emitting diodes 15 for a backlight are mounted on a FPC 11 and, at the same time, the FPC 11 is folded back and is wrapped around a back surface of the backlight and is fixed to the back-surface side of the mold 1 using a pressure sensitive adhesive double coated tape 31. Here, the FPC 11 is folded outside a frame of the frame-like mold 1. Then, the white light emitting diodes 15 are mounted on a surface of the FPC 11 which faces the liquid crystal panel in an opposed manner in a state that the FPC 11 is folded in the vicinity of a folded portion of the FPC 11 and, at the same time, the white light emitting diodes 15 are accommodated in the inside of the frame of the mold 1. Although not shown in the drawing, in the frame-like mold 1, recessed portions 16 are formed in the back-surface side and the white light emitting diodes 15 are inserted into the recessed portions 16.

Further, as shown in FIG. 9A and FIG. 9B, in this embodiment, a width of a portion of the FPC 11 which faces the liquid crystal display panel in a state that the FPC 11 is folded is increased such that the width approximates a mold width. Further, the recessed portions are formed in the back-surface side of long-side portions of the mold 1, and electronic parts 22 which are mounted on a mold-side surface of the FPC 11 are mounted in the inside of the recessed portions.

Figure 10:
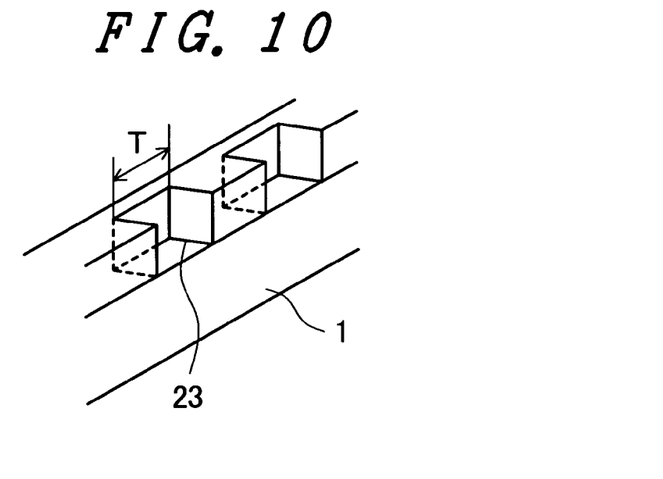
FIG. 10 is a schematic perspective view for explaining a recessed portion formed on a back-surface side in a long-side portion of a mold in a liquid crystal display module of the embodiment 3 of the present invention.
Figure 11:
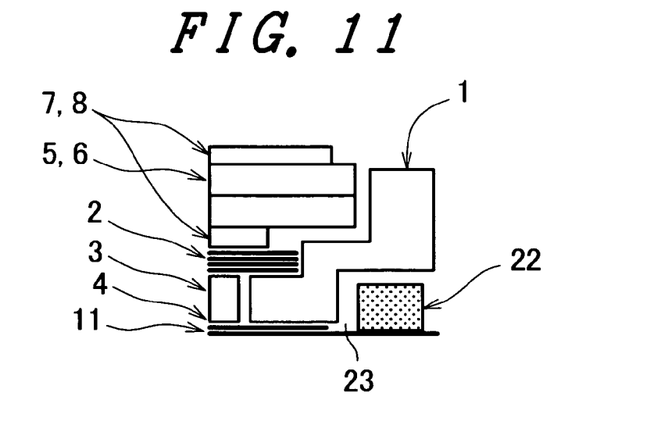
FIG. 11 is a cross-sectional view showing the cross-sectional structure taken along a line A-A' in FIG. 9A.

FIG. 10 is a schematic perspective view for explaining the recessed portion formed on the back-surface side of the long-side portion of the mold 1, and FIG. 11 is a cross-sectional view showing the cross-sectional structure taken along a line A-A' in FIG. 9.

As can be understood from these drawings, a wall of the mold 1 remains between the recessed portion 23 formed in the mold 1 and the light guide plate 3.

To sufficiently ensure a region for forming the recessed portion 23, assuming that the recessed portion is not formed in the frame-like mold 1, it is preferable to provide a first portion A, a second portion B and a third portion C where a frame width of the mold is increased in a step-like manner as explained in conjunction with FIG. 5 and FIG. 8 of the embodiment 2. Then, it is preferable to form the recessed portion 23 in the third portion C which has the largest frame width. Further, by adopting the constitution in which the liquid crystal display panel is accommodated in the first portion A and a light guide body is accommodated in the third portion C, it is possible to also obtain an advantageous effect that the brightness is enhanced as explained in conjunction with the embodiment 2.

Here, it is preferable that a plurality of recessed portions 23 is formed at a predetermined interval. A length of one recessed portion 23 (T in FIG. 10) is set to 10 mm or less as measured in the extending direction of the side wall in which the recessed portions 23 are formed in view of strength of the mold 1. The length of one recessed portion 23 is more preferably set to 5 mm or less. Here, provided that the mold 1 has the sufficient strength, the recessed portions 23 may be formed on the whole long side of the mold 1 or half region of the long side of the mold 1.

The recessed portion 23 may be formed on only one of two long sides which face in an opposed manner or may be formed on both long sides.

Figure 12:
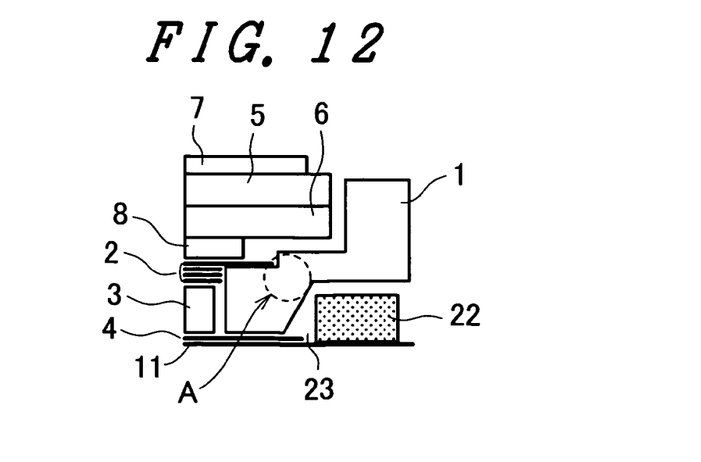
FIG. 12 is a cross-sectional view showing a modification of the cross-sectional structure taken along a line A-A' in FIG. 9A.

FIG. 12 is a cross-sectional view showing a modification of the cross-sectional structure taken along a line A-A' in FIG. 9A.

As indicated by A in FIG. 12, provided that a wall thickness which allows the forming of the mold 1 by molding or the strength of the mold is ensured, the recessed portion 23 which is formed in the mold 1 may be formed in a tapered shape.

In this manner, according to this embodiment, since the electronic part accommodating region is formed on the long-side portion of the mold 1, it is possible to decrease a length (a length indicated by B in FIG. 9B) of the mold 1. Accordingly, it is possible to shorten the long-side size of the mold 1 and hence, it is possible to reduce a profile size of the liquid crystal display module.

Here, also in this embodiment, cutouts 21 may be formed in the FPC 11 as in the case of the above-mentioned respective embodiments.

In the embodiment, a folded portion of the FPC 11 can be made small and hence, a spring-back force of the FPC 11 is extremely increased. Further, since a length indicated by B in FIG. 9B is small, a distance from the folded portion to the white light emitting diode 15 becomes small whereby the floating of the white light emitting diode 15 is largely influenced by the spring-back force. Accordingly, in this embodiment, the formation of the cutouts 21 in the FPC 11 in the same manner as the above-mentioned respective embodiments brings about large advantageous effects in preventing the lowering of the brightness by avoiding a floating of the white light emitting diode 15.

Here, in the above-mentioned embodiments 1 to 3, the FPC 11 is folded on the short-side. However, the FPC 11 may be folded on the long-side. In this case, the relationship between the short-side and the long-side in each embodiment becomes opposite.

Further, the structure of the cutouts formed in the reflection sheet 4 which is explained in conjunction with FIG. 4A and FIG. 4B of the embodiment 2 may be applied to the embodiment 1 or the embodiment 3.

Further, the electronic part accommodating structure explained in conjunction with the embodiment 3 is not limited to the liquid crystal display device and may be applicable to another type of display device such as an organic EL display device.

Although the inventions which are made by inventors of the present invention have been specifically explained in conjunction with the embodiments heretofore, it is needless to say that the present invention is not limited to these embodiments and various modifications are conceivable without departing from a gist of the present invention.

What is claimed is:

1. A liquid crystal display device comprising:
   a liquid crystal display panel;
   a backlight which is arranged on a back-surface side of the liquid crystal display panel; and
   a flexible printed wiring board which has one end thereof connected to a terminal portion of the liquid crystal display panel, wherein
   the backlight includes a frame-like mold,
   the flexible printed wiring board is folded and has a portion thereof arranged on a back-surface side of the frame-like mold, the flexible printed wiring board includes an electronic part, the frame-like mold includes a first short-side side wall, a second short-side side wall, a first long-side side wall and a second long-side side wall, the first short-side side wall and the second short-side side wall are opposed to each other, the first long-side side wall and the second long-side side wall are opposed to each other and are connected to the first short-side side wall and the second short-side side wall, the flexible printed wiring board is folded at the first short-side side wall, and the first long-side side wall of the frame-like mold includes a recessed portion which opens on the back-surface side of the frame-like mold and into which the electronic part is inserted.

2. A liquid crystal display device according to claim 1, wherein the second long-side side wall of the frame-like mold includes a recessed portion which opens on the back-surface side of the frame-like mold and into which the electronic part is inserted.

3. A liquid crystal display device according to claim 1, wherein a plurality of recessed portions are formed in the first long-side side wall at a predetermined interval.

4. A liquid crystal display device according to claim 1, wherein a length of the recessed portion is 10 mm or less when measured in the extending direction of the first long-side side wall.

5. A liquid crystal display device according to claim 1, wherein a length of the recessed portion is 5 mm or less when measured in the extending direction of the first long-side side wall.

6. A liquid crystal display device according to claim 1, wherein the backlight includes a light guide body, the first long-side side wall and the second long-side side wall of the frame-like mold, assuming that the recessed portion is not provided, include first to third portions which change frame widths thereof in a step-like manner, the second portion exhibits a larger frame width of the frame-like mold than the first portion, and the third portion exhibits a larger frame width of the frame-like mold than the second portion, the first portion accommodates the liquid crystal display panel therein, the third portion accommodates the light guide body therein, and the recessed portion into which the electronic part is inserted is formed in the third portion.

7. A liquid crystal display device according to claim 1, wherein the back light includes a reflection sheet and the reflection sheet is fixed to the back-surface side of the frame-like mold.

8. A liquid crystal display device according to claim 1, wherein the flexible printed wiring board is adhered to the back-surface side of the frame-like mold using a pressure-sensitive adhesive double-coated tape.

9. A liquid crystal display device according to claim 7, wherein the flexible printed wiring board is adhered to the frame-like mold at a region outside the reflection sheet in a plan view.

10. A liquid crystal display device according to claim 7, wherein the reflection sheet includes a cutout portion which exposes a back-surface side of the mold in a portion of a region which is covered with the flexible printed wiring board, and the flexible printed wiring board is adhered to the frame-like mold in the cutout portion.

* * * * *